United States Patent [19]
Furukawa

[11] Patent Number: 5,634,166
[45] Date of Patent: May 27, 1997

[54] HEAT TREATMENT DEVICE FOR PRINTING FORM

[75] Inventor: Koji Furukawa, Shizuoka, Japan

[73] Assignee: Fuji Photo Film Co., Ltd., Kanagawa, Japan

[21] Appl. No.: 552,570

[22] Filed: Nov. 3, 1995

[30] Foreign Application Priority Data

Nov. 21, 1994 [JP] Japan .................. 6-286813

[51] Int. Cl.$^6$ .................. G03D 7/00; G03D 13/00
[52] U.S. Cl. .................. 396/571; 396/579; 396/612
[58] Field of Search .................. 354/300; 347/262; 346/24, 25; 355/285, 290, 329 R, 329 M; 396/571, 579, 612

[56] References Cited

U.S. PATENT DOCUMENTS 3,781,902 12/1973 Shim et al. .................. 354/297
4,975,716 12/1990 Hara et al. .................. 347/262
5,196,675 3/1993 Suzuki et al. .................. 219/216

FOREIGN PATENT DOCUMENTS 61-153651 7/1986 Japan .................. 354/300

*Primary Examiner*—D. Rutledge
*Attorney, Agent, or Firm*—Sughrue, Mion, Zinn, Macpeak & Seas

[57] ABSTRACT

A heat treatment device for a printing form in which the contact of the printing form with a heating plate can be made more complete to achieve heat development reproducing complete images. The device comprises a heating means for surface heating the photosensitive planographic printing form having a metal support and continuous belt for covering the whole printing form to hold it between a continuous belt and the heating means and heating the printing form while transferring it along the continuous belt. The heat treatment device further comprises at least one tension roller for increasing the pressure on the continuous belt at a central portion of the printing form to laterally distribute the pressure.

4 Claims, 3 Drawing Sheets

HEAT TREATMENT DEVICE FOR PRINTING FORM

FIELD OF THE INVENTION

The present invention relates to a heat treatment device for heating an exposed photosensitive planographic printing form, and is applicable as a device for heat developing printing forms.

BACKGROUND OF THE INVENTION

Examined Japanese patent publications JP-B-3-12307 and JP-B-3-12308 (U.S. Pat. No. 4,629,676 and European Patent Publication No. 0174634) disclose methods comprising the steps of subjecting photosensitive materials containing silver halides, reducing agents and polymerizable compounds to image exposure; and developing the silver halides, thereby polymerizing the polymerizable compounds in the image to form polymer images. In these methods, polymerization is initiated by oxidant radicals of the reducing agents which have reduced the silver halides. (The radicals may be radicals produced by decomposition of oxidants of the reducing agents and are hereinafter referred to as "radicals"). More specifically, the photosensitive materials are subjected to heat development, thereby developing the silver halides and forming hardened images of the polymerizable compounds. The image forming methods described above can also be applied to the production of printing forms.

Photosensitive materials suitable for the production of printing forms are described in unexamined Japanese patent applications JP-A-5-249667 (U.S. Pat. No. 5,122,443 and European Patent Publication No. 0426192), JP-A-4-191856 (U.S. Pat. No. 5,290,659), JP-A-5-142775, JP-A-6-27652 and JP-A-5-107764. These documents disclose the use of crosslinking polymers in addition to or in place of the polymerizable compounds. In the methods for producing printing forms, the polymerizable compounds or the crosslinking polymers are hardened by the above-mentioned heat treatment. Then, unhardened portions are removed by using eluents. The remaining hardened portions are used as images for the printing forms.

In the printing forms, aluminum plates are generally used as supports. In the photosensitive materials used in the forms, the photosensitive layers containing silver halides and the hardenable layers containing polymerizable compounds or crosslinking polymers are separately provided in many cases.

When images are formed on the printing forms using the aluminum supports and photosensitive hardenable layers containing the silver halides; the reducing agents, the polymerizable compounds and color image forming materials, it becomes necessary to use a heat treatment device.

A conventional heat treatment device is shown in FIG. 5. Referring to FIG. 5, a photosensitive planographic printing form 114 is covered with a continuous belt 138 to hold the printing form 114 between the belt 138 and a heating plate 130. As the belt moves, the printing form is brought into sliding contact with the heating plate 130 and is heated by the heating plate 130 at the same time. The surface of the heating plate is curved in a circular arc, and the form 114 is formed thin enough to be curved along this arc. Tension is imparted to the continuous belt 138 to force the printing form 114 towards the heating plate 130. Transfer rollers 122 and 124 are mounted before and after the heating plate 130 with respect to the transfer direction A. The roller 122 guides the printing form 114 between the heating plate 130 and the continuous belt 138, and the transfer roller 124 guides the form out of the heating area.

When the printing form 114 is between the heating plate 130 and the continuous belt 138, the form is transferred by movement of the continuous belt 138 which is moving in the direction D. During the transfer, the form is heated as it is brought into sliding contact with the heating plate 130. Tension is imparted to the continuous belt 138 by means of the curvature 130B of the heating plate surface, thereby forcing the printing form towards the heating plate and resulting in close contact of the printing form with the heating plate. Thus, the printing form is heated throughout. The photosensitive material is heated at a temperature between 70° and 200° C.

When the heat treatment device shown in FIG. 5 is used for heat development, a metal support of a base on the printing form is expanded by this heating, causing slight distortion in the form. This results in incomplete contact with the heating plate 130. Moreover, when the photosensitive material is heat developed, heat energy supplied to the photosensitive material is decreased due to the distortion and incomplete contact. This causes a reduction in heat development efficiency. As a result, a polymerized hardened image is deficient at the point of deformation, or the degree of hardening is decreased and lowers the image strength. Accordingly, the press's usefulness is partially deteriorated. Furthermore, when attempts are made to form minute dots having a halftone dot area rate of 2% at a halftone dot number of 200 lines per inch, the inefficiency of heat development at the portions of incomplete contact cause insufficient hardening. Therefore, the minute halftone dots formed at these areas have a smaller size compared with the dots formed at a complete contact portion, and the resulting color tone is different. Thus, the image's uniformity deteriorates, and an objective for using the printing form is not satisfied.

Printing forms are usually large, and therefore incomplete contact due to heat expansion is liable to take place. This is one deficiency in the conventional art. In addition, because image density depends on the proper formation of minute halftone dots, it is very important to make the printing forms with uniform minute halftone dots.

SUMMARY OF THE INVENTION

An object of the present invention is to provide a heat treatment device for a printing form in which the contact of the printing form with a heating plate can be made more complete to achieve heat development reproducing complete images.

According to the present invention, there is provided a heat treatment device for a printing form comprising: a heating means for surface heating a photosensitive planographic printing form having a metal support; and a continuous belt for covering the whole printing form to hold the form between said continuous belt and said heating means and heating said printing form while transferring it along said continuous belt, said heat treatment device further comprising at least one tension roller for increasing the pressure on the continuous belt at a central portion of the printing form to laterally distribute the pressure.

DETAILED DESCRIPTION OF THE INVENTION

Figure 1:
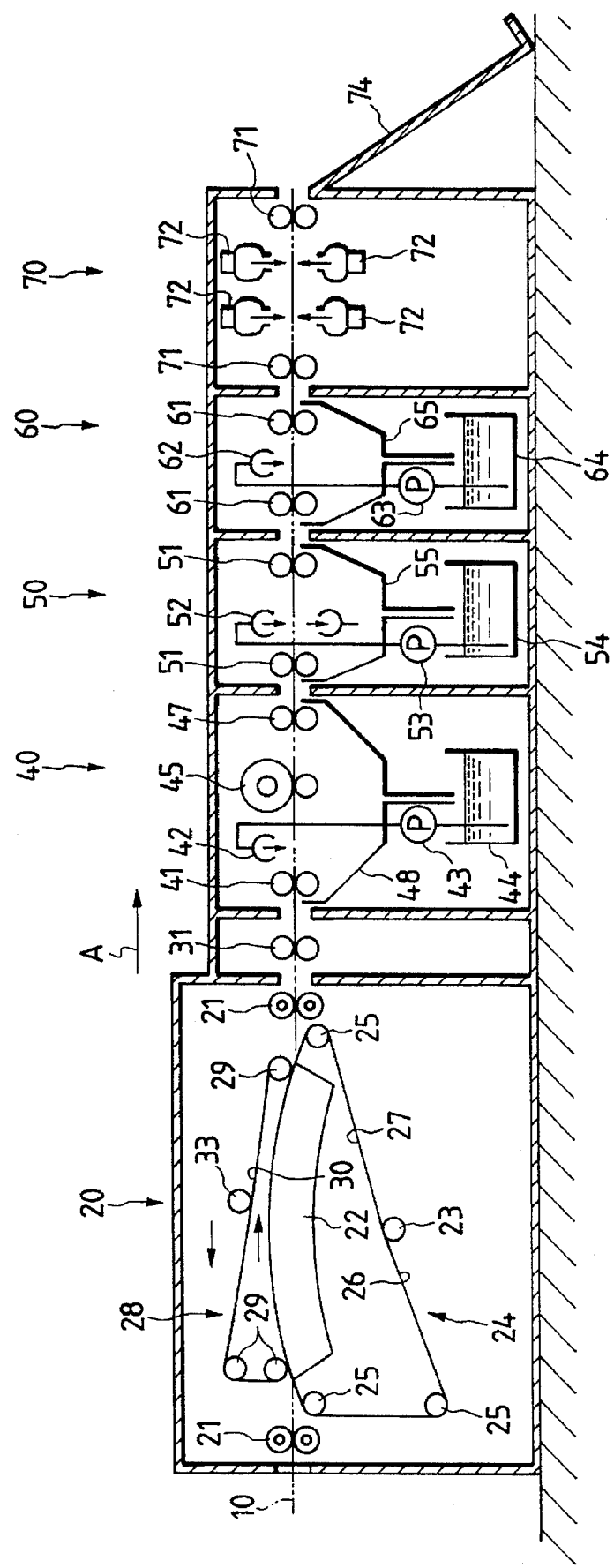
FIG. 1 is a schematic cross sectional view showing a pre-press processing apparatus to which a first embodiment of a heat treatment device of the present invention is applied.

In the heat treatment device according to the present invention, the pressure on the continuous belt is increased at a central portion of the printing form to laterally distribute pressure on the form. This distributes the effect of expansion caused by heat generated in the metal support of the printing form to the side portions of the form, allowing the form to be brought into contact with the heating means more completely.

The present invention will be described with reference to examples shown in the drawings.

FIG. 1 is a schematic cross sectional view showing a prepress processing apparatus to which a first embodiment of a heat treatment device of the present invention is applied.

Referring to FIG. 1, a printing form 10 comprises a support substrate and an image forming layer. The support substrate is formed of aluminum and has a thickness of about 0.3 mm. The image forming layer is formed by overlapping a hardenable layer, a photosensitive layer, and an image formation promoting layer on the upper surface of the substrate.

In a heat development unit 20, the printing form 10 is guided by a transfer roller 21 between an upper continuous belt 28 and a lower continuous belt 24. The upper continuous belt 28 and the lower continuous belt 24 are moved in synchronism with each other with the printing form 10 held between them. Together, they transfer the printing form 10 along a heating plate 22 in the indicated direction A. The form is heated by heat conducted from the heating plate 22 through the lower continuous belt 24.

In an elution unit 40, the printing form 10 supplied from the heat development unit 20 by a cooling roller 31 is transferred by means of transfer rollers 41. After the form is sprayed with an eluent injected from a spray nozzle 42 and placed in sliding contact with brush rollers 45, excess eluent adhering to the surface of the printing form 10 is removed by the squeeze rollers 47.

The transfer rollers 41 are installed above and below the printing form 10, upstream from the spray nozzle 42 in the transfer direction A, and are driven for rotation with the printing form 10. The rollers thus transfer the printing form 10 in the direction A.

In this example, the spray nozzle 42 is disposed opposite the image forming layer which constitutes the upper surface of the printing form 10. The nozzle sprays an eluent (for example, pre-sensitized plate developer DP-4 manufactured by Fuji Photo Film Co. Ltd.) pumped from an elution tank 44 by means of a circulating pump 43 onto the image forming layer of the printing form 10.

The brush roller 45 and a support roller 46 are installed above and below the printing form 10, downstream from the spray nozzle 42 in the transfer direction A. The image forming layer of the printing form 10 on which the eluent has been sprayed is brought into sliding contact with the brush roller 45, thereby promoting elution reaction of non-image regions.

The squeeze rollers 47 are installed above and below the printing form 10, downstream from the brush roller 45 in the transfer direction A. The rollers are driven for rotation with the printing form 10, transfer the printing form 10, and remove excess eluent adhered to the surface of the printing form 10 by using a squeeze action. The excess eluent removed with the squeeze rollers 47 is recovered in the elution tank 44 through a pan 48.

In a washing unit 50, the printing form 10 is transferred by means of transfer rollers 51, and washing water is sprayed on the form by a pair of spray nozzles 52.

One pair of transfer rollers 51 is installed upstream from the spray nozzles 52 in the transfer direction A. One roller is installed above and one is installed below the printing form 10. Another pair of transfer rollers 51 is similarly installed downstream from the spray nozzles 52. The transfer rollers 51 are driven for rotation with the printing form and transfer the form 10 in the direction A.

The pair of spray nozzles 52 are disposed opposite both surfaces of the printing form and spray washing water pumped from a water receiving tank 54 by means of a circulating pump 53 onto both surfaces of the printing form 10. Excess water dripping from the printing form 10, is recovered in the water receiving tank 54 through a pan 55.

In a gum solution coating unit 60, the printing form 10 is transferred by means of transfer rollers 61, and a gum solution is sprayed on the form with a spray nozzle 62.

One pair of transfer rollers 61 is installed upstream from the spray nozzle 62 in the transfer direction A. One roller is installed above and one is installed below the printing form. Another pair of transfer rollers 61 is similarly installed downstream from the spray nozzle 62. The transfer rollers 61 are driven for rotation with the printing form 10 and transfer the printing form 10 in the direction A.

The spray nozzle 62 is disposed opposite the image forming layer of the printing form and sprays a gum solution (for example, pre-sensitized plate gum solution GU-7 manufactured by Fuji Photo Film Co. Ltd.) pumped from a gum solution tank 64 by means of a circulating pump 63 onto the image forming layer of the form. Excess gum solution dripping from the printing form, is recovered in the gum solution tank 64 through a pan 65.

In a drying unit 70, the printing form 10 is transferred by means of transfer rollers 71 and dried with dryers 72.

One pair of transfer rollers 71 is installed upstream from the dryers 72 in the transfer direction A. One roller is installed above the printing form and one installed below. Another pair of transfer rollers 71 is similarly installed downstream from the dryers 72. The transfer rollers 71 are driven for 20 rotation with the printing form 10 and transfer the form in the direction A.

The two pairs of dryers 72 are disposed opposite to both surfaces of the printing form and blow hot air on both surfaces of the form, thereby drying the form which has been gum treated.

A sequence of operations is described below. First, in an exposing device not shown in the drawings, an original film is brought into close contact with the image forming layer side of the printing form. An exposure is made through a filter passing the light of 500 nm by use of a tungsten lamp of 500 watts for 1.5 seconds to prepare the exposed printing form. Then, as shown in FIG. 1, the printing form is continuously transferred from the heat development unit 20 to the drying unit 70 through the elution unit 40, the washing unit 50 and the gum solution coating unit 60, and is subjected to specified treatments in each of the units.

Specifically, the heat-developed printing form 10 is cooled with the cooling roller 31, followed by elution in the elution unit 40. The unit elutes the image formation promoting layer, the photosensitive layer, and unhardened portions of the hardenable layer or non-image regions of the image forming layer, except the hardened portions of the hardenable layer. The printing form is washed in the washing unit 50 to remove the eluent and is then coated with the gum solution in the gum solution coating unit 60. The gum solution adhering to the surface of the printing form is dried in the drying unit 70. After drying, the form is transferred to a tray 74 for storage.

Figure 2:
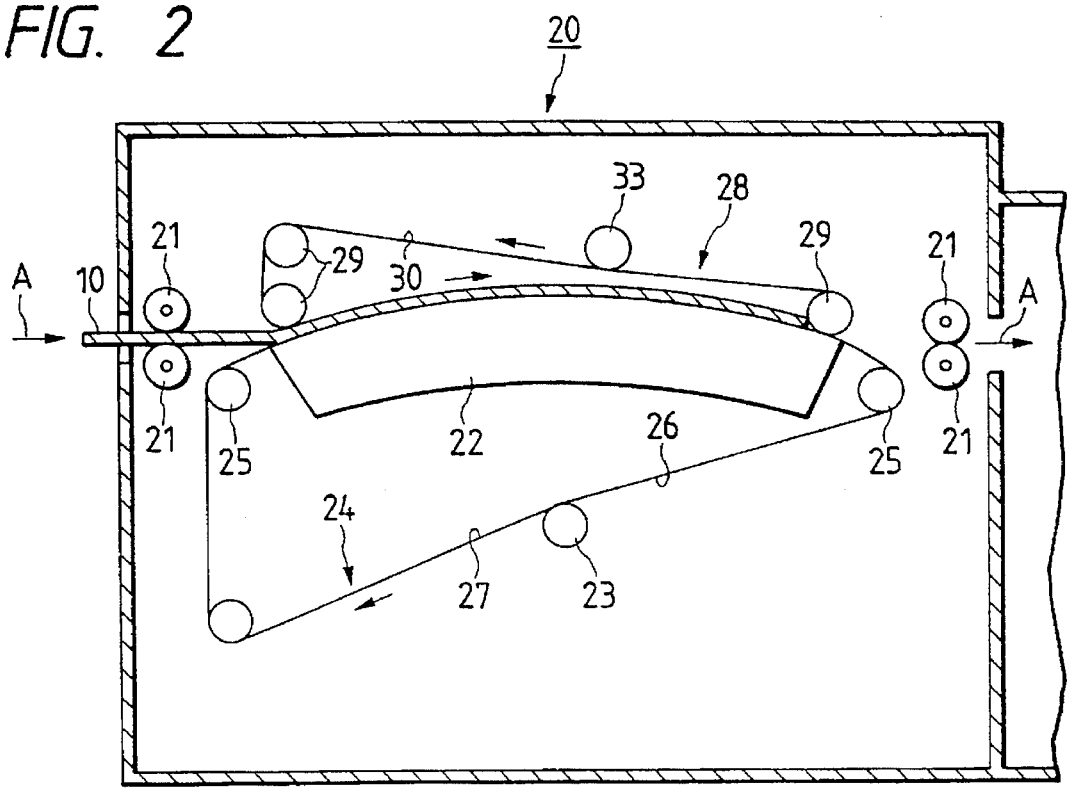
FIG. 2 is a schematic cross sectional view showing the heat treatment device of the prepress processing apparatus shown in FIG. 1.

The heat treatment device of the present invention will be illustrated below. FIG. 2 is an enlarged cross sectional view showing the heat treatment device shown in FIG. 1, and FIG. 3 is a perspective view showing the heat treatment device shown in FIG. 1.

Transfer rollers 21 are installed above and below the printing form, upstream from the heating plate 22 in the transfer direction A. Another pair of transfer rollers 21 is similarly installed downstream from the heating plate 22. The transfer rollers 21 are driven for rotation with the printing form 10. The first pair of rollers guides the form between the upper continuous belt 28 and the lower continuous belt 24, and the second pair guides it out of the area.

The upper surface of the heating plate 22 is curved in a circular arc and is heated with a general heater to maintain a constant surface temperature, for example 150° C.

Figure 3:
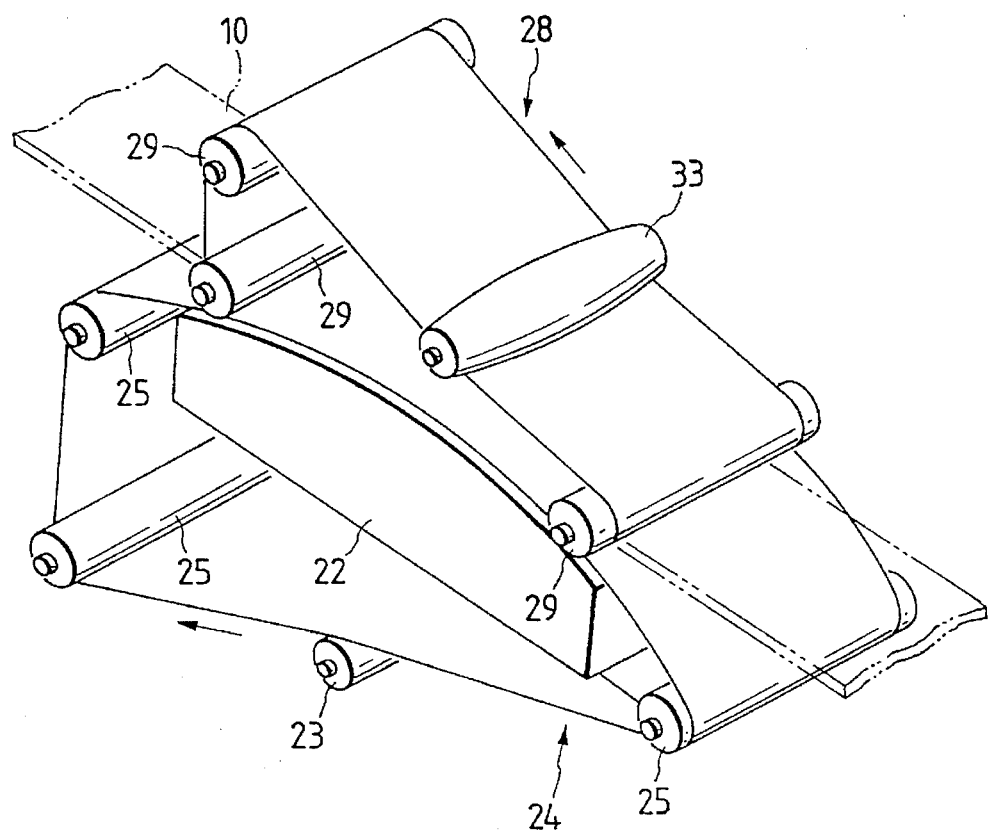
FIG. 3 is a perspective view showing the heat treatment device shown in FIG. 2.

The lower continuous belt 24 is installed around lower rollers 25 located upstream and downstream from the heating plate 22 in the transfer direction A as shown in FIGS. 2 and 3. When the rollers 25 are driven for rotation by means of a motor (not shown), the continuous belt 24 is moved clockwise in FIG. 2. A tension roller 23 presses the continuous belt 24 on an outer surface 26 to impart tension to the continuous belt. Stated differently, the lower continuous belt 24 is moved in the transfer direction A along the surface of the heating plate 22 while bringing the outer surface 26 of the continuous belt 24 into contact with a lower surface of the form and bringing an inner surface 27 into sliding contact with the surface of the heating plate 22. The lower continuous belt 24 is formed to have a width that almost covers the curved heating surface of the heating plate 22.

The upper continuous belt 28 is installed around upper rollers 29 located above the end portions of the heating plate 22 in the transfer direction. When the rollers 29 are driven for rotation by means of a motor (not shown), the upper continuous belt 28 is moved counterclockwise in FIG. 2 in synchronism with the movement of the lower continuous belt 24. The upper continuous belt 28 is pressed on an outer surface 30 a convex crown roller 33 acting as a tension roller.

The convex crown roller 33 distributes tension. As the tension is increased at a central portion of the upper continuous belt 28, it is distributed in the lateral direction. The pressure, which allows the upper continuous belt 28 to be brought into close contact with the heating plate 22 and which is produced by the curvature of the surface of the heating plate 22, is also exerted on the upper continuous belt 28. This pressure coupled with the tension at the central portion of the upper continuous belt 28 causes an increase in pressure at the central portion toward the heating plate 22. The printing form is brought into contact with the outer surface 30 of the upper continuous belt 28 formed to have width approximating that of the heating plate 22. The upper continuous belt 28 is pressed toward the heating plate 22 bringing it into close contact with the lower continuous belt 24 and covering the printing form so as to hold the form between the upper continuous belt and the lower continuous belt. The continuous belt 28 is transferred in the same direction as the continuous belt 24 in this state. Accordingly, expansion of the substrate of the printing form can be dispersed to the side portions by increasing pressure at the central portion. This eliminates having portions of the printing form which do not come into contact with the heating plate 22.

Figure 4:
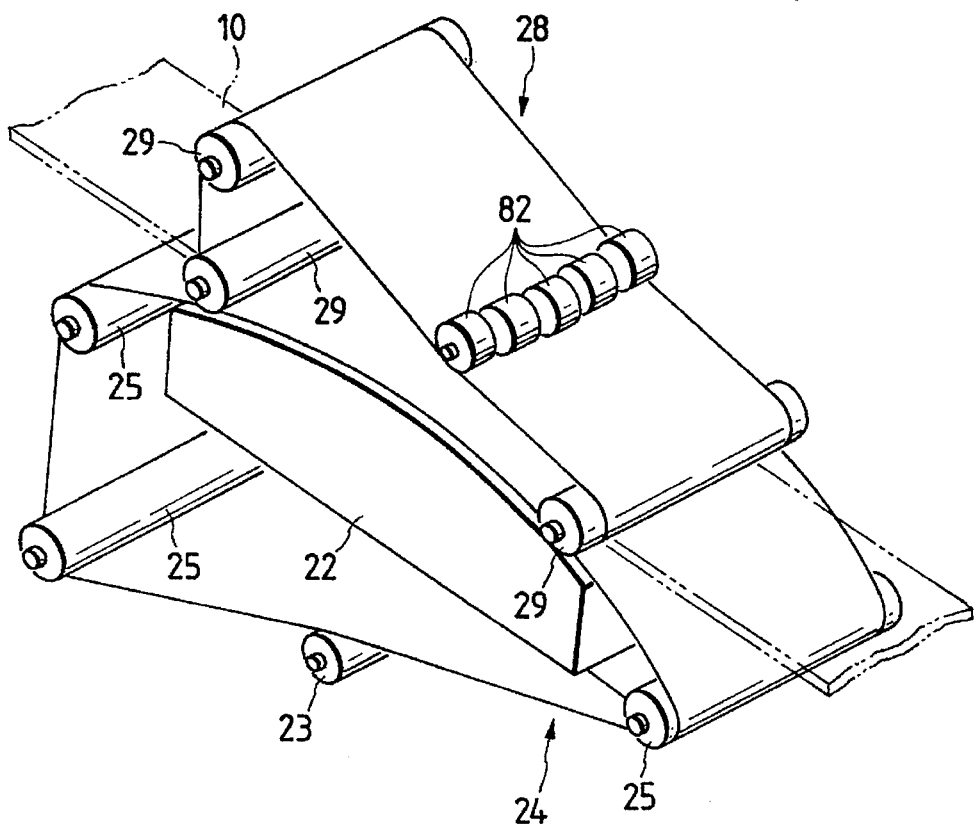
FIG. 4 is a perspective view showing a second embodiment of a heat treatment device of the present invention.
Figure 5:
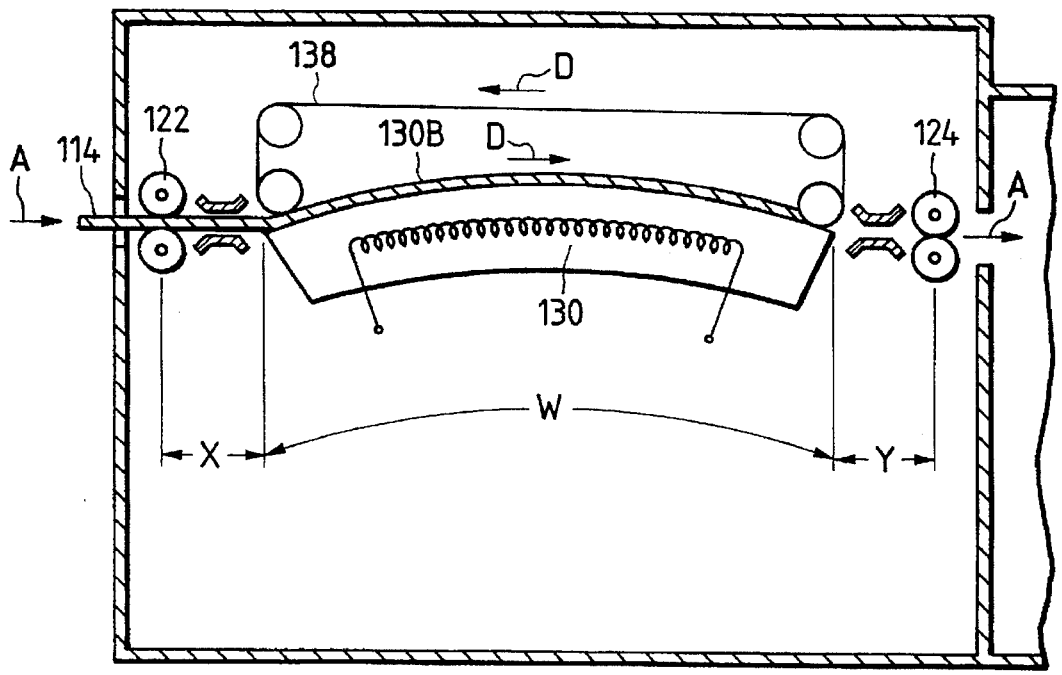
FIG. 5 is a schematic cross sectional view showing a conventional heat treatment device.

FIG. 4 is a schematic perspective view showing a heat development unit 80 of a prepress processing apparatus to which a second embodiment of a heat treatment device of the present invention is applied. In FIG. 4, the reference characters used in FIG. 3 are used to designate corresponding elements in FIG. 4. Descriptions of the elements are omitted. In essence, the same structure can be employed, except for the tension roller, for exerting tension to the upper continuous belt 28.

Referring to FIG. 4, the upper continuous belt 28 is pressed on the outer surface 30 by means of a plurality of tension rollers 82 having the same diameter. With regard to the tension rollers 82, in order to increase the pressure of a central tension roller exerted on the upper continuous belt 28, shafts of the respective rollers 82 are separate from one another, and the tension rollers 82 are each provided with springs (not shown).

Pressure distribution produced by the tension rollers 82 increases the tension at a central portion of the upper continuous belt 28, and the curvature of the heating plate 22 further increases the pressure of the continuous belt 28 exerted on the printing form at the central portion. Therefore, as in the first embodiment, expansion of the substrate of the printing form 10 can be dispersed to the side portions, thereby eliminating production of printing forms having portions which do not come into contact with the heating plate 22.

Although the tension rollers discussed above have the same diameter, it is also possible to attain desired pressure distribution by disposing a roller having a maximum diameter at a central portion and rollers of decreasing diameters towards the side portions.

In the embodiments described above, the pressure distribution on the upper continuous belt by means of the tension roller 33 or the tension rollers 82 is preferably about 30 g/cm$^2$ at the central portion, and about 15 g/cm$^2$ at the side portions. However, in addition to these embodiments, the non-contacting portion in a printing form can be eliminated as long as the pressure is increased at the central portion.

As described above, according to the present invention, expansion caused by heating the metal support of the photosensitive planographic printing form can be dispersed to side portions of the printing form to allow the form to be brought into contact with the heating means more completely. The heat treatment device for the printing form comprises a continuous belt for covering the whole printing form to hold it between the continuous belt and a heating means, and heating the printing form while transferring it along the continuous belt, said heat treatment device further comprising at least one tension roller for increasing the pressure on the continuous belt at the central portion of the printing form to laterally distribute pressure.

What is claimed is:

1. A heat treatment device for a printing form comprising:
    a heating means for surface heating a photosensitive planographic printing form having a metal support;
    an endless belt for covering the printing form to hold it between said endless belt and said heating means, and heating said printing form while transferring it longitudinally along said endless belt; and at least one tension roll for applying tension to said endless belt such that the pressure of said endless belt at a central portion of the printing form is greater than the pressure at lateral sides thereof.

2. The heat treatment device as claimed in claim 1, wherein said tension roll is a convex crown roll.

3. The heat treatment device as claimed in claim 1, wherein said tension roll includes a plurality of rollers disposed in the lateral direction of said endless belt, each of the rollers being provided with a forcing means so that a centrally located roller of said plurality of rollers is pressed on said endless belt at a higher pressure than one or more non-centrally located rollers.

4. A heat treatment device for a printing form comprising:

a heating means for surface heating a photosensitive planographic printing form having a metal support;

a first continuous rotating belt;

a second continuous rotating belt passing between said heating means and said first belt; and at least one tension roller disposed to displace a natural path of said first belt in a direction towards said heating means and further disposed at a central portion of said first belt such that the tension at said central portion is greater than the tension at lateral side portions thereof;

wherein said printing form is conveyed between an outer surface of said first belt and an outer surface of said second belt and wherein an inner surface of said second belt is in slidable contact with a surface of said heating means for heating and transferring said form when said form is in frictional contact therewith.

* * * * *